(12) United States Patent
Zhang

(10) Patent No.: US 10,763,416 B2
(45) Date of Patent: Sep. 1, 2020

(54) LIGHT EMITTING DEVICE AND LEADFRAME THEREOF

(71) Applicant: KAISTAR Lighting (Xiamen) Co., Ltd, Xiamen (CN)

(72) Inventor: Jingqiong Zhang, Xiamen (CN)

(73) Assignee: KAISTAR LIGHTING (XIAMEN) CO., LTD., Xiamen (CN)

( * ) Notice: Subject to any disclaimer, the term of this patent is extended or adjusted under 35 U.S.C. 154(b) by 23 days.

(21) Appl. No.: 16/112,755

(22) Filed: Aug. 26, 2018

(65) Prior Publication Data
US 2019/0097109 A1 Mar. 28, 2019

(30) Foreign Application Priority Data
Sep. 27, 2017 (CN) .......................... 2017 1 0888133

(51) Int. Cl.
*H01L 29/205* (2006.01)
*H01L 33/00* (2010.01)
*H01L 33/64* (2010.01)
*H01L 33/48* (2010.01)
*H01L 25/075* (2006.01)
*H01L 33/62* (2010.01)

(52) U.S. Cl.
CPC .......... *H01L 33/644* (2013.01); *H01L 33/486* (2013.01); *H01L 33/642* (2013.01); *H01L 33/647* (2013.01); *H01L 25/0753* (2013.01); *H01L 33/62* (2013.01); *H01L 33/641* (2013.01)

(58) Field of Classification Search
None
See application file for complete search history.

(56) References Cited

U.S. PATENT DOCUMENTS

| 2004/0017661 A1* | 1/2004 | Siegel | H01L 23/3121 361/705 |
| 2012/0153317 A1* | 6/2012 | Emerson | G02F 1/133603 257/89 |
| 2012/0261689 A1* | 10/2012 | Appelt | H01L 21/4832 257/98 |
| 2017/0345714 A1* | 11/2017 | Scharf | H01L 24/06 |

FOREIGN PATENT DOCUMENTS

CN 105098046 A 11/2015

* cited by examiner

*Primary Examiner* — Calvin Y Choi
(74) *Attorney, Agent, or Firm* — Hemisphere Law, PLLC; Zhigang Ma

(57) ABSTRACT

A LED leadframe for securing a LED chip includes a metallic base and an insulating layer. The metallic base includes a die bonding region and a peripheral region surrounding the die bonding region, and the die bonding region is for securing the LED chip. The insulating layer is disposed on the metallic base and located in the peripheral region to define the die bonding region. The insulating layer includes a bar-shaped insulating section disposed in the metallic base and corresponding to the die bonding region. The metallic base includes a first groove(s) defined corresponding to the die bonding region. The first groove(s) is/are filled with a thermally conductive filler. The invention improves the LED leadframe to allow heat conducting efficiencies of various regions of the base to be controllable and adjustable so as to reduce temperature differences among various regions of the base and thereby unify the temperature.

20 Claims, 9 Drawing Sheets

LIGHT EMITTING DEVICE AND LEADFRAME THEREOF

TECHNICAL FIELD

The disclosure relates to a photoelectric technical field, and more particularly to a light-emitting diode (LED) and a LED leadframe.

DESCRIPTION OF RELATED ART

Nowadays, LEDs have stepped in various realms of daily life, which can bring enjoyment and convenience.

As applications of LED products, quality requirements on light emitting device are higher. LED chips are concentrated on a LED substrate to form a light-emitting surface, and therefore a heat dissipation efficiency and a thermal distribution uniformity of the LED substrate are critical factors in affecting quality of a light emitting device. The low heat dissipation efficiency and uneven thermal distribution will severely degrade reliability of the entire light emitter.

A conventional LED leadframe 100 may have various different sizes. Taking surface-mounted device (SMD) 5050 type (5 mm in length and 5 mm in width) LED chips arranged sparsely as an example, the amount of the mounted LED chips is relatively small, but distances among the chips are large.

In combination with the illustration of FIG. 1, a distance between two adjacent chips 101 is D1, and a distance from an edge of the LED leadframe to an edge of the chip is D2. A temperatures of a region where the chips 101 are located is high, and a temperature of a region distant from the chips 101 is low; moreover, resulting from that in the LED leadframe, the chips are arranged sparsely, the distance D1 between two adjacent chips 101 and the distance D2 from the edge of the LED leadframe to the edge of the chip both are relatively large, a temperature difference between the high temperature and the low temperature in the LED leadframe consequently can be up to more than ten degrees Celsius, which results in severely uneven thermal distribution.

The uneven thermal distribution will lead to a poor quality of a light emitting device.

On one hand, a conventional LED leadframe includes a silicone, an insulating layer and a metal base, which are bonded one another by adhesive materials. As a coefficient of thermal expansion (CTE=13 ppm/C) of the insulating layer is lower than a CTE (=17.6 ppm/C) of the metal (copper) base, edges of the insulating layer generate tensile stress, and the edges can easily be curved. A bonding force between the insulating layer and the silicone turns to be weaker, which can generate a gap for infiltrating moisture. On the other hand, a CTE of the silicone generally is 220 ppm/° C., when a central temperature of the die bonding region is relatively high and the temperature difference of the LED leadframe is relatively large, the silicone in the middle will be accelerated to expand, and under an alternate cooling and heating condition, a position with relatively high temperature can easily break down due to stress fatigue, as well as the invasion of moisture through the gap. Meanwhile, the CTE of the silicone and that of the insulator are considerably different to cause poor bonding between the silicone and lateral walls of the insulator under the alternate cooling and heating condition, and more gaps will appear, which finally result in the vapor invades into the leadframe. The silver is oxidized by the vapor to be black and thereby causes lumen decay, which results in severely degrading quality and reliability of the light emitter.

SUMMARY

In order to solve the problems above, the disclosure provides a LED leadframe configured (i.e., structured and arranged) for mounting a LED chip(s) thereon. The LED leadframe includes an insulating layer and a metallic base. The metallic base includes a die bonding region and a peripheral region surrounding the die bonding region. The die bonding region is configured for mounting the LED chip(s) thereon. The die bonding region includes a chip-mounted section(s) and a chip-blank section. The insulating layer is disposed on the metallic base and located in the peripheral region to define the die bonding region. The metallic base further includes at least one first groove defined corresponding to the chip-mounted section(s). The at least one first groove is filled with a thermally conductive filler, and a thermal conductivity of the thermally conductive filler is larger than a thermal conductivity of the metallic base. Furthermore, a first connective channel may be defined between two adjacent first grooves, and the first connective channel is filled with the thermally conductive filler.

In an embodiment, the amount of the at least one first groove is multiple, and the multiple first grooves are distributed to be axisymmetric or non-axisymmetric.

In an embodiment, the metallic base further includes at least one second groove defined corresponding to the chip-blank section, the at least one second groove is filled with a second filler (a low specific heat capacity filler), and a specific heat capacity of the second filler is lower than a specific heat capacity of the metallic base.

In an embodiment, a second connective channel is defined between two adjacent second grooves, and the second connective channel is filled with the second filler.

In an embodiment, the at least one second groove extends into the peripheral region.

In an embodiment, the amount of the at least one second groove is multiple, and the multiple second grooves are distributed to be axisymmetric or non-axisymmetric.

The disclosure further provides another LED leadframe configured for securing a LED chip. The LED leadframe includes a metallic base and an insulating layer.

In particular, the metallic base includes a die bonding region and a peripheral region surrounding the die bonding region. The die bonding region is configured for securing the LED chip thereon. The die bonding region includes a chip-mounted section and a chip-blank section.

The insulating layer is disposed on the metallic base and located in the peripheral region to define the die bonding region.

The metallic base further includes a second groove defined corresponding to the chip-blank section, the second groove is filled with a low specific heat capacity filler, and a specific heat capacity of the filler is smaller than a specific heat capacity of the metallic base.

In an embodiment, the metallic base further includes a first groove defined corresponding to the chip-mounted section. The first groove is filled with a thermally conductive filler, and a thermal conductivity of the thermally conductive filler is larger than a thermal conductivity of the metallic base.

The disclosure further provides a light emitting device, including LED chips, a package glue and any one of the LED leadframes above. The LED chips are mounted on the chip-mounted sections of the die bonding region. The package glue is filled in the die bonding region and covers the LED chips.

Sum up, by adding the thermally conductive filler of high thermal conductivity onto the metallic base, the compressive stress generated in the region whose temperature is high can be reduced, and the possibility of promoting heat accumulation caused by expansionary deformation of the metallic base can be reduced consequently.

By regulating the shape of the groove disposed in the metallic base, the distance from the insulating layer to the center of the LED chip can be shortened, the distance conveying heat is reduced, temperature differences among various regions are lowered, which can achieve the purpose of the temperatures tending to be consistent.

Heat conducting effects of the disclosure are controllable and adjustable, which can both cut the budget and utilize resources to the fullest extent.

DETAILED DESCRIPTION OF PREFERRED EMBODIMENTS

In the following, the disclosure will be described in detail with reference to concrete embodiments.

First Embodiment

Figure 1:
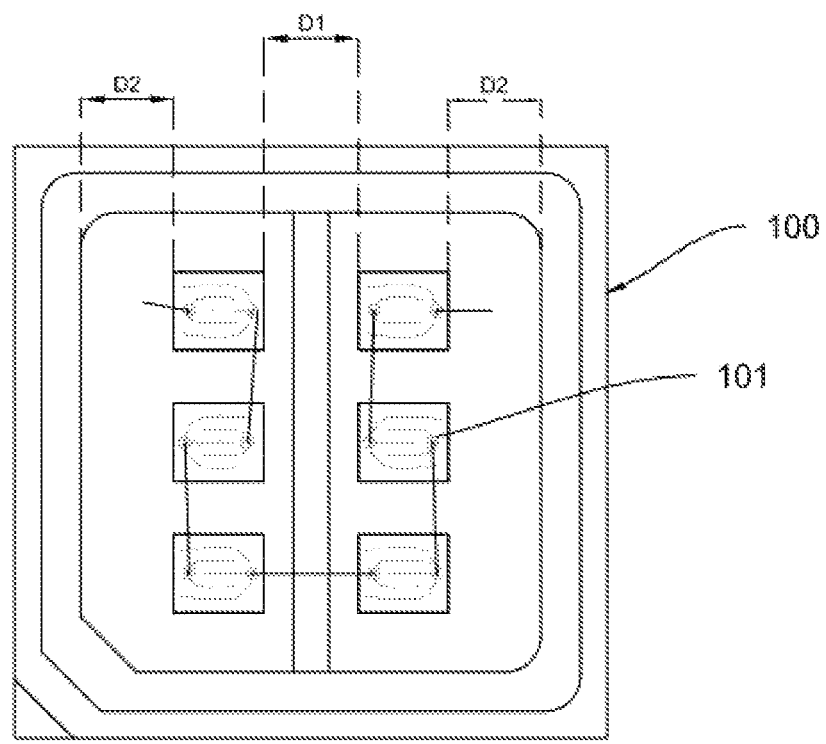
FIG. 1 is a structural schematic view of a light emitting device in the related art.
Figure 2A:
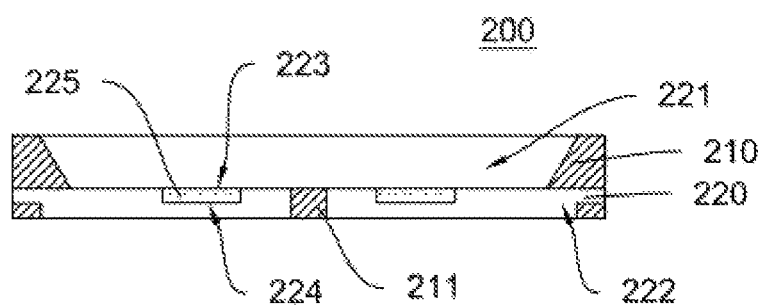
FIG. 2a is a cross-sectional structural schematic view of a LED leadframe of a first embodiment of the disclosure.
Figure 2B:
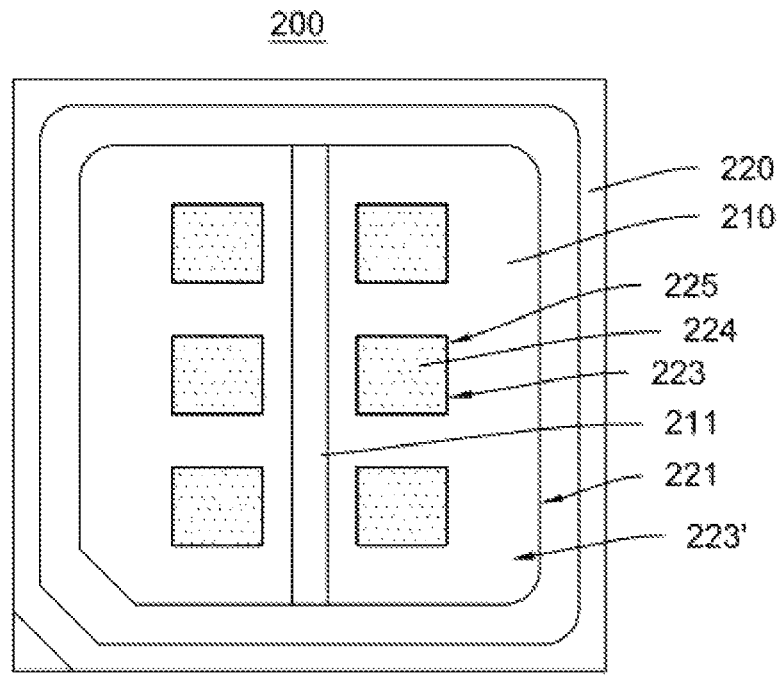
FIG. 2b is a top structural schematic view of the LED leadframe of the first embodiment of the disclosure.

As shown in FIG. 2a and FIG. 2b, the embodiment provides a LED leadframe 200 configured for securing a LED chip(s) (not shown). The LED leadframe 200 includes an insulating layer 210 and a metallic base 220.

Specifically, the metallic base 220 includes a die bonding region 221 and a peripheral region 222 surrounding the die bonding region 221. The die bonding region 221 includes chip-mounted sections 223 and a chip-blank section 223'. The chip-mounted sections 223 are configured for securing the LED chips thereon and can be defined by projections of the LED chips on the die bonding region 221. The region other than the chip-mounted sections 223 is the chip-blank section 223'. The die bonding region 221 can be square, rectangular, round, bowl-shaped or other geometrical shape. Similarly, the chip-mounted sections 223 each can be square, rectangular, triangular or round based on the shape of the LED chip.

The insulating layer 210 is disposed on the metallic base 220 and located in the peripheral region 222 to define the die bonding region 221. The insulating layer 210 further includes a bar-shaped insulating section 211 disposed in the metallic base 220 and corresponding to an insulating region in the die bonding region 221. The bar-shaped insulating section 211 can be disposed corresponding to a central axis or an eccentric axis (non-central axis) of the metallic base 220.

A material of the insulating layer 210 of the embodiment can be a thermoset epoxy molding compound (EMC) or a thermoset unsaturated polyester (UP). A specific heat capacity of the EMC approximately is 550 J/Kg·° C., and a CTE thereof is 13 ppm/° C., which is a material with a slow heating rate.

A material of the metallic base 220 can be copper whose CTE is 17.6 ppm/° C. or aluminum whose CTE is 23-24 ppm/° C. The CTE of the metallic base 220 is higher than that of the insulating layer 210.

It can be achieved from an experimental result of a packaged LED light source at a lighted condition that an overall expansionary deformation of the LED light source caused by uneven thermal distribution will be considerably reduced when the temperature difference on the metallic base 220 is no more than 5° C. Therefore, the embodiment may change the material of the metallic base 220, i.e., introduce heat conductor with high thermal conductivity into a region of the metallic base 220 with heavy heat accumulation, to decrease the temperature difference in the LED light source resulting from the heat accumulation.

The metallic base 220 is disposed beneath the insulating layer 210. At least one chip-mounted section 223 configured for securing the LED chip(s) is provided on the metallic base 220 corresponding to the die bonding region 221.

The metallic base 220 is further defined with multiple (i.e., more than one) first grooves 224. The first grooves 224 can be disposed to be axisymmetric or non-axisymmetric. The first grooves 224 are filled with thermally conductive fillers 225. The first grooves 224 and the thermally conductive fillers 225 are preferably corresponding to the chip-mounted sections 223. After the LED chips are assembled on the chip-mounted sections 223, heat generated by the LED chips causes great amount of continuously accumulated heat in the chip-mounted sections 223, and at this situation the thermally conductive fillers 225 corresponding to the chip-mounted sections 223 can accelerate heat dissipation, and thereby effectively reduce the local temperature of the metallic base 220.

Preferably, a thermal conductivity of the thermally conductive fillers 225 is larger than a thermal conductivity of the insulating layer 220. As a result, the positions with the thermally conductive fillers 225 can rapidly dissipate heat and thereby achieve higher heat dissipation efficiency.

Furthermore, the shape of the first grooves 224 can be various, such as rectangle, round or oval, and correspondingly the thermally conductive fillers 225 in the first grooves 224 are prismatic or cylindrical, which are capable of achieving the objective of the disclosure. For instance, the chip-mounted sections 223 in the embodiment include several rectangular regions with a same size and are evenly disposed on two sides of the bar-shaped insulating section 211. The chip-mounted sections 223 are aligned to be an array. The number of the first grooves 224 is equivalent to that of the chip-mounted sections 223. Positions and shapes of the first grooves 224 respectively are in accordance with those of the chip-mounted sections 223. In combination with the illustration of FIG. 2a, depths of the first grooves 224 are the same, and thus thicknesses of the thermally conductive fillers 225 in the first grooves 224 are accordingly equal, so that multiple cuboids with substantially equal sizes are formed corresponding to the chip-mounted sections 223. The thermally conductive fillers can be regulated according to specific positions of LED chips. In other embodiments, the bar-shaped insulating section is disposed leftward or rightward with respect to the symmetrical axis of the die bonding region rather than on the symmetrical axis, and at this situation the LED chips will be disposed asymmetrically such as on one side of the bar-shaped insulating section, or more on the left side and less on the right side, or more on the right side and less on the left side; correspondingly, the thermally conductive fillers will be disposed beneath the LED chips.

In addition, a material of the thermally conductive fillers 225 may be a filler with high thermal conductivity or a filler with high CTE. For instance, if the metallic base 220 is pure copper whose thermal conductivity is 401 W/mK, the thermally conductive fillers 225 can be pure silver whose thermal conductivity is 429 W/mK or graphene whose thermal conductivity is 5300 W/mK. If the metallic base 220 is an aluminum, the thermally conductive fillers 225 can be any one of copper, silver and graphene.

Figure 2C:
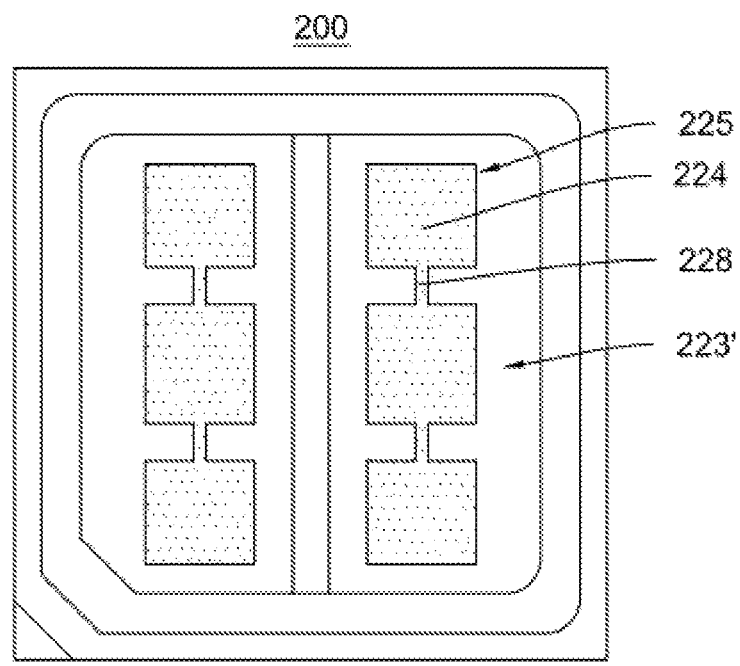
FIG. 2c is a top structural schematic view of another LED leadframe of the first embodiment of the disclosure.

Preferably, in order to simplify the manufacturing process and improve the procedure efficiency, a first connective channel 228 can be defined between two adjacent first grooves 224, and the first connective channel 228 is further filled with the thermally conductive filler 225. As shown in FIG. 2c, in contrast with the LED leadframe in FIG. 2b, individual first grooves 224 are communicated through first connective channels 228 as a whole, and subsequent pouring thermally conductive fillers to be integrally formed.

The embodiment introduces the thermally conductive fillers into the die bonding region of the metallic base, and flexibly adjusts positions and shapes of the thermally conductive fillers in the die bonding region according to heat accumulation levels, so as to accelerate heating conducting capability of a central region of a light-emitting surface, temperature differences among various regions of the light-emitting surface can be reduced and an overall temperature tends to be consistent.

Second Embodiment

Figure 3A:
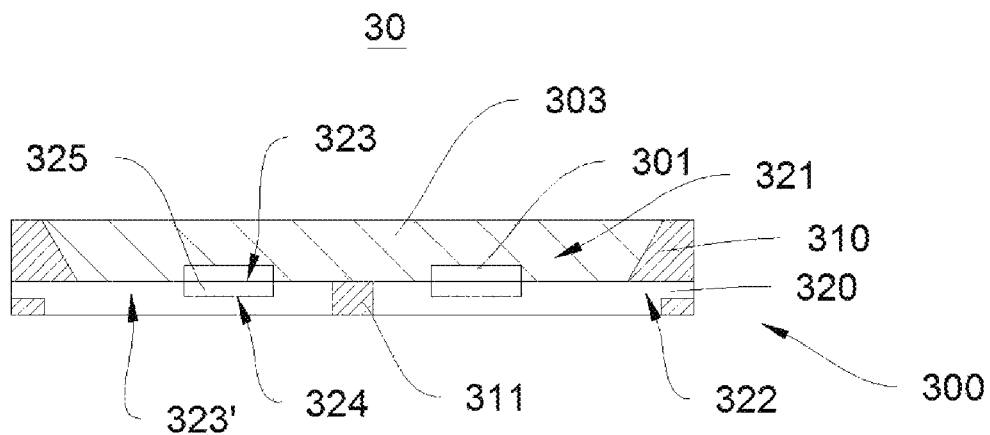
FIG. 3a is a cross-sectional structural schematic view of a light emitting device of a second embodiment of the disclosure.
Figure 3B:
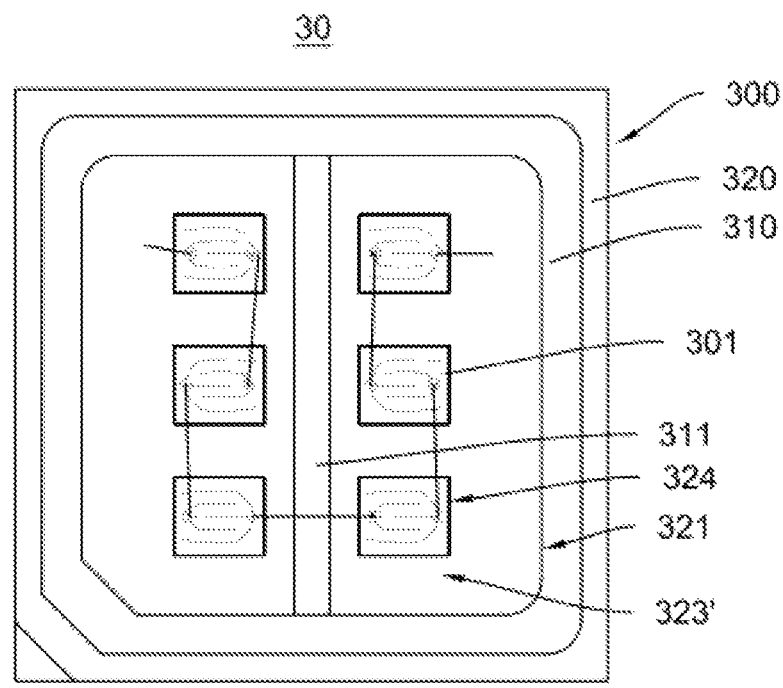
FIG. 3b is a top structural schematic view of the light emitting device of the second embodiment of the disclosure.

As shown in FIG. 3a and FIG. 3b, the embodiment provides a light emitting device 30, including at least one LED chip 301, a LED leadframe 300 and a package glue 303 (silicone). The LED chips 301 are secured in the LED leadframe 300, and the package glue 303 covers the surfaces of the LED chips 301.

Specifically, the number of LED chips 301 can be odd number or even number.

The LED leadframe 300 of the embodiment includes an insulating layer 310 and a metallic base 320.

In particular, the metallic base 320 includes a die bonding region 321 and a peripheral region 322 surrounding the die bonding region 321. The die bonding region 321 includes chip-mounted sections 323 and a chip-blank section 323'. The chip-mounted sections 323 are configured for securing the LED chips thereon, and can be defined by projections of the LED chips on the die bonding region 321. A region other than the chip-mounted sections 323 is the chip-blank section 323'. The die bonding region 321 can be square, rectangular, round, bowl-shaped or other geometrical shape; similarly, the chip-mounted sections 323 can be square, rectangular, triangular or round based on the shapes of the LED chips.

The insulating layer 310 is disposed on the metallic base 320 and located in the peripheral region 322 to define the die bonding region 321. The insulating layer 310 further includes a bar-shaped insulating section 311 disposed in the metallic base 320 and corresponding to the die bonding region 321. The bar-shaped insulating section 311 can be disposed corresponding to a central axis of the metallic base 320. The thermally conductive fillers can be regulated according to specific positions of the LED chips. In other embodiments, the bar-shaped insulating section is disposed leftward or rightward with respect to the symmetrical axis of the die bonding region rather than on the symmetrical axis. In this situation, the LED chips can be disposed asymmetrically such as on one side of the bar-shaped insulating section, or more on the left side and less on the right side, or more on the right side and less on the left side, correspondingly the thermally conductive fillers are disposed beneath the LED chips.

The package glue 303 covers the LED chips 301 and corresponding to the die bonding region 321. The package glue 303 is connected with both of the metallic base 320 and the insulating layer 310, which can settle the LED chips 301 in a relatively airtight condition to prevent the vapor from invading in. Specifically, a material of the package glue 303 can be silicone.

A material of the insulating layer 310 of the embodiment can be a thermoset epoxy molding compound (EMC) or a thermoset unsaturated polyester (UP). Therefore, the insulating layer 310 can be called as an EMC insulating layer. A specific heat capacity of EMC is about 550 J/Kg·° C., and a CTE thereof is 13 ppm/° C., which is a material with a slow heating rate.

The material of the metallic base 320 can be copper whose CTE is 17.6 ppm/° C. or aluminum whose CTE is 23-24 ppm/° C. The CTE of the metallic base 320 is higher than that of the insulating layer 310.

It can be achieved from results of repeated tests that an expansionary deformation caused by uneven thermal distribution will be considerably reduced when the temperature difference on the metallic base 320 is no more than 5° C. Therefore, the region with severe heat accumulation in the metallic base 320 is added with thermal conductors of high thermal conductivity, the heat dissipation performance of the die bonding region 321 is enhanced.

The metallic base 320 is disposed beneath the insulating layer 310. The metallic base 320 corresponding to the die bonding region 321 is exposed. The LED chips 301 are arranged on two sides of the bar-shaped insulating section 311. The projection of each LED chip 301 on the die bonding region 321 can be defined as a chip-mounted section 323 with the minimal area. Generally, in order to evenly dissipate heat, the amount of LED chips generally is even number, consequently, the LED chips can be evenly distributed on two sides of the bar-shaped section 311 and arranged in an array, and chip-mounted sections 323 are distributed symmetrically on two sides of the bar-shaped insulating section 311 according to the number of LED chips and arranged in an array correspondingly, which are shown in FIG. 3b. Correspondingly, in combination with the illustration of FIG. 3a, the first grooves 324 (or thermally conductive fillers 325) are preferably to correspond to chip-mounted sections 323 respectively. That is, each chip-mounted section 323 has its thermal conductor responsible for heat dissipation, such as the LED leadframe in the first embodiment shown as FIG. 2b can fulfill the design of the LED chips of the embodiment. Of course, thermal conductors can be regulated according to specific positions of LED chips. In other embodiments, the bar-shaped insulating section is disposed leftward or rightward with respect to the symmetrical axis of the die bonding region rather than on the symmetrical axis, and the LED chips may be disposed asymmetrically such as on one side of the bar-shaped insulating section, or more on the left side but less on the right side, or more on the right side but less on the left side; correspondingly the thermal conductors will be respectively disposed beneath the LED chips.

Figure 4A:
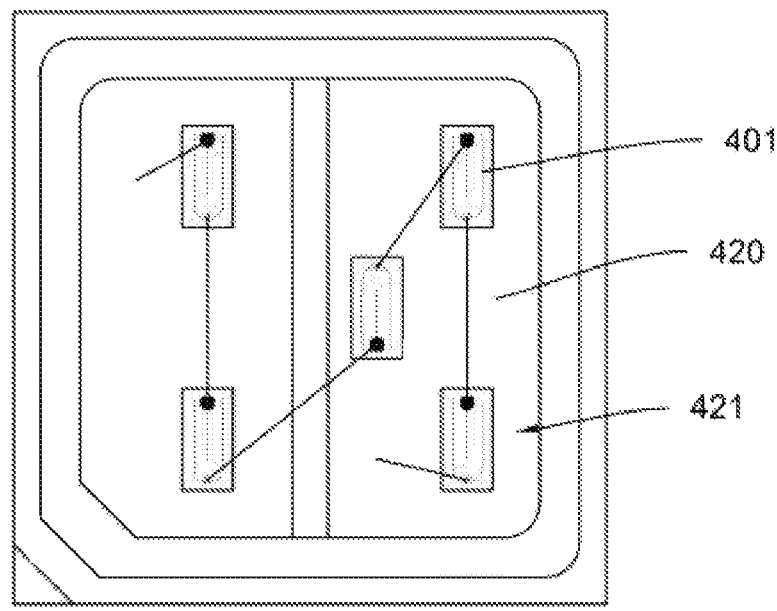
FIG. 4a is a top structural schematic view of another light emitting device of the second embodiment of the disclosure.
Figure 4B:
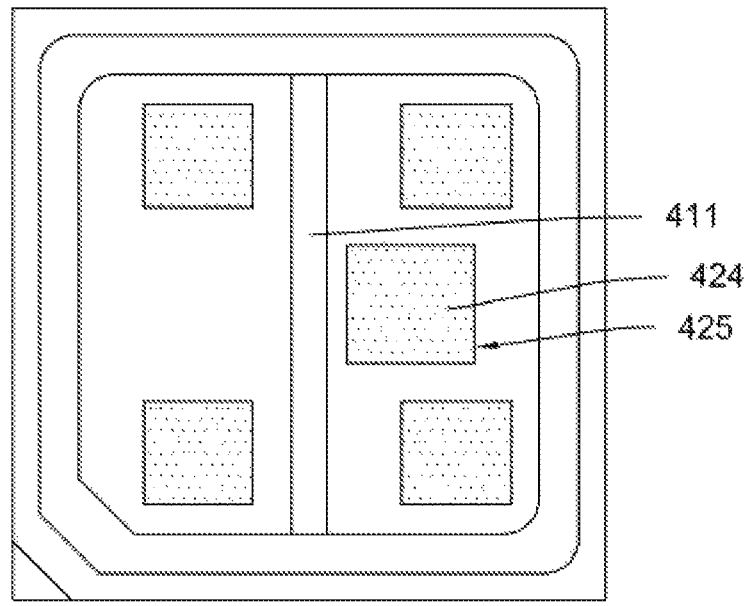
FIG. 4b is a top structural schematic view of another LED leadframe of the second embodiment of the disclosure.

In addition, only odd number of LED chips 401 can be disposed in the symmetrical leadframe in some particular circumstances, such as shown in FIG. 4a and FIG. 4b, LED chips 401 are asymmetrically distributed over the entire die bonding region 421. Analogously, as shown in FIG. 4a and FIG. 4b, first grooves 424 are defined in the metallic base and asymmetrically distributed on two sides of the bar-shaped insulating section 411. Positions of openings of the first grooves 424 respectively are corresponding to LED chips 401. The first grooves 424 are filled with thermally conductive fillers 425, and a material of the thermally conductive fillers 425 is a highly thermal conductive material, and a thermal conductivity thereof is larger than that of the metallic base. At this situation, the first grooves 424 and the thermally conductive fillers 425 therein are asymmetrically distributed over the die bonding region 421. The design of adjusting heat conducting efficiency can control the thermal distribution difference, which can reduce the stress caused by temperature difference and thereby result in improved reliability.

Shapes of the thermally conductive fillers and shapes of the first grooves can be referred to that in the first embodiment, and thus will not be repeated herein.

Additionally, the thermally conductive fillers can be highly thermal conductive fillers or fillers with high CTE. For instance, if the metallic base is pure copper whose thermal conductivity is 401 W/mK, the thermally conductive fillers can be made of pure silver whose thermal conductivity is 429 W/mK or graphene whose thermal conductivity is 5300 W/mK. If the metallic base is an aluminum, the thermally conductive fillers can be made of any one of copper, silver and graphene.

Figure 4C:
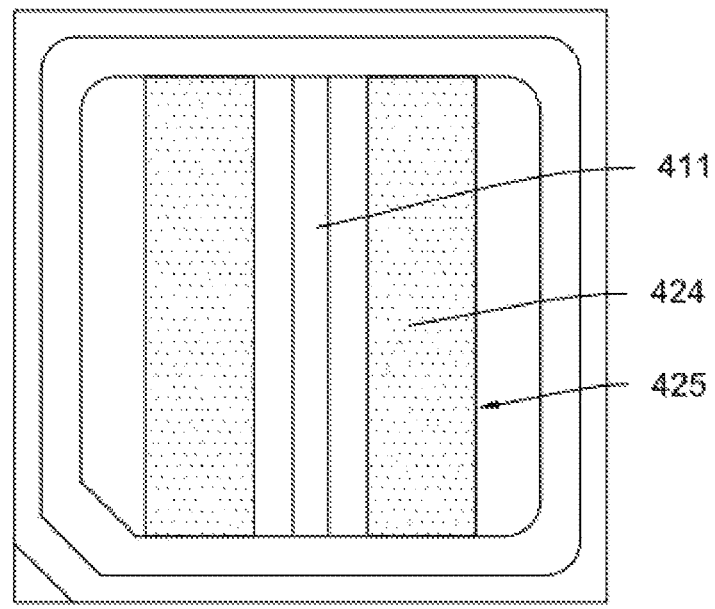
FIG. 4c is a top structural schematic view of still another LED leadframe of the second embodiment of the disclosure.

Furthermore, when the LED chips are arranged densely in large amounts, a distance between two adjacent chip-mounted sections is shortened and a thermal difference is decreased correspondingly, in order to reduce the manufacturing difficulty and costs, numerous chip-mounted sections can correspond to one large-sized thermally conductive filler. As shown in FIG. 4c, two large-sized first grooves 424 respectively are defined on the left side and the right side (or the upper side and the lower side instead) of the bar-shaped insulating section 411, the opening shape of each first groove 424 is rectangular and the opening area is larger than the summation of areas of all the chip-mounted sections (not shown) on the same side, so as to make a heat conducting area of the thermally conductive filler 425 in the first groove 424 be no smaller than the summation of areas of all the chip-mounted sections (not shown) on the same side.

Figure 4D:
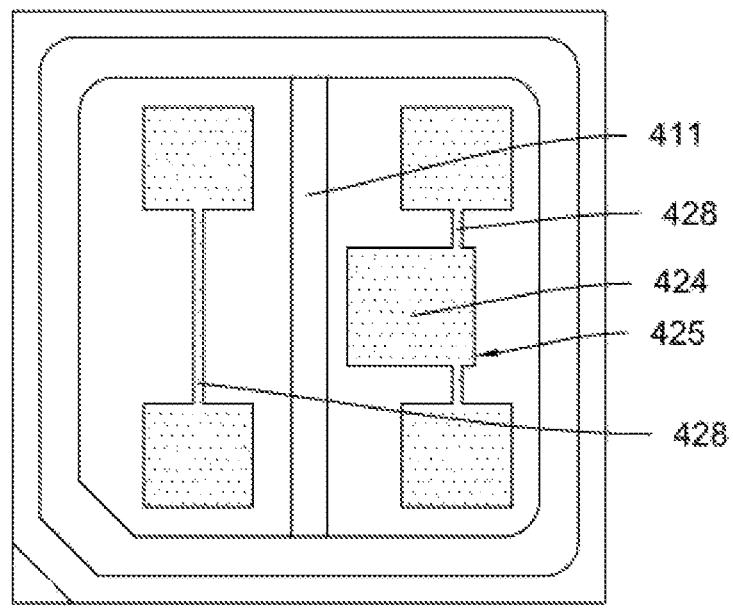
FIG. 4d is a top structural schematic view of even still another LED leadframe of the second embodiment of the disclosure.

Or, as shown in FIG. 4d, a first connective channel is defined between two adjacent first grooves 424 on the same side, and the first connective channel 428 is further filled with the thermally conductive filler 425. Individual separated first grooves 424 are communicated by the first connective channel(s) as a whole, and subsequent pouring thermally conductive fillers to be integrally formed.

Third Embodiment

A difference from the first embodiment is that the embodiment introduces thermal conductors with low specific heat capacity into regions of the metallic base whose temperatures are low. The thermal conductors can absorb certain amount of heat and own relatively high heating rates, so as to achieve the objective of reducing the temperature difference between regions with high and low temperatures.

Accordingly, the embodiment further employs fillers with low specific heat capacity on the basis of the first embodiment.

Figure 5A:
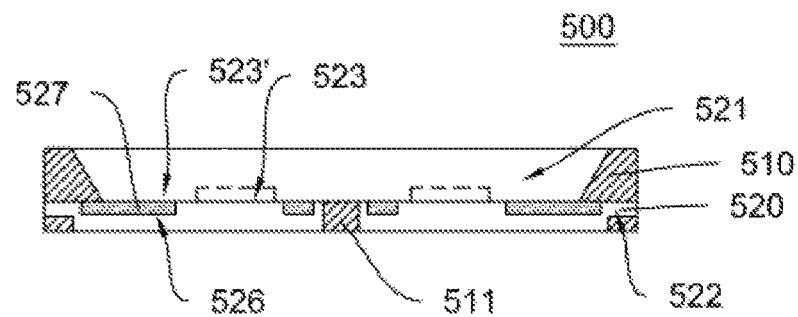
FIG. 5a is a cross-sectional structural schematic view of a LED leadframe of a third embodiment of the disclosure.

As shown in FIG. 5a, a LED leadframe 500 of the embodiment is configured for securing LED chips as shown by dashed lines in FIG. 5a. The LED leadframe 500 includes an insulating layer 510 and a metallic base 520.

Specifically, the metallic base 520 includes a die bonding region 521 and a peripheral region 522 surrounding the die bonding region. The die bonding region 521 includes chip-mounted sections 523 and a chip-blank section 523'. The chip-mounted sections 523 are configured for securing the LED chips thereon and can be defined by projections of the LED chips on the die bonding region 521. A region other than the chip-mounted sections 523 is the chip-blank section 523'. The die bonding region 521 can be square, rectangular, round, bowl-shaped or other geometrical shape; analogously, the chip-mounted sections 523 can be square, rectangular or round based on the shapes of the LED chips.

The insulating layer 510 is disposed on the metallic base 520 and located in the peripheral region 522 to define the die bonding region 521. The insulating layer 510 further includes a bar-shaped insulating section 511 disposed in the metallic base 520 and corresponding to the die bonding region 521.

The metallic base 520 is disposed beneath the insulating layer 510. The metallic base 520 corresponding to the die bonding region 521 is exposed, such as regions between the bar-shaped insulating section 511 and the chip-mounted sections 523 and regions from external edges of the insulating layer 510 to the adjacent chip-mounted sections all can be regarded as the chip-blank section 523'.

Figure 5B:
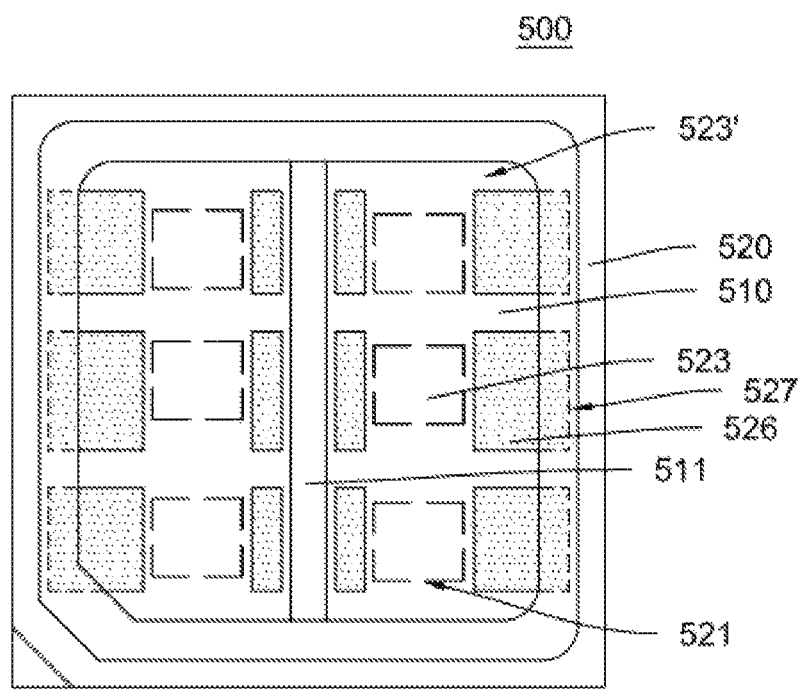
FIG. 5b is a top structural schematic view of the LED leadframe of the third embodiment of the disclosure.

Furthermore, in combination with the illustration of FIG. 5b, the metallic base 520 further includes several second grooves 526 whose sizes are different. The second grooves 526 are disposed adjacently to the chip-mounted sections 523 and corresponding to the chip-blank section 523', and the second grooves 526 are filled with fillers 527 with low specific heat capacity. For instance, in the embodiment, the chip-blank section 523' between the chip-mounted sections 523 and the insulating layer 510 is relatively narrow, and correspondingly opening shapes of the second grooves 526 are relatively narrow. The second grooves 526 are spaced apart from each other between the chip-mounted sections 523 and the insulating layer 510; analogously, the chip-blank section 523' between the chip-mounted sections 523 and edges of the metallic base 520 is relatively wide, and correspondingly shapes of the second grooves 526 are relatively wide; the second grooves 526 are spaced apart from each other between the chip-mounted sections 523 and the edges of the metallic base 520. Such that, the embodiment defines a number of second grooves 526 in the chip-blank section 523', and the opening areas of the second grooves 526 can be adjusted according to the area of the chip-blank section 523', which can be rectangular, round or oval, and the fillers with low specific heat capacity filled in the second grooves 526 accordingly appear to be prismatic, bowl-shaped or cylindrical, and the aforementioned shapes all can obtain the objective of the disclosure.

Of course, the thermally conductive fillers can be regulated according to specific positions of the LED chips. In other embodiments, the bar-shaped insulating section is disposed leftward or rightward with respect to the symmetrical axis of the die bonding region rather than on the symmetrical axis. In the situation, the LED chips can be disposed asymmetrically such as on one side of the bar-shaped insulating section, or more on the left side but less on the right side, or more on the right side but less on the left side; correspondingly the thermally conductive fillers are disposed beneath the LED chips.

When chips are arranged sparsely or distances between the chip-mounted sections 523 and the chip-blank section 523', the distance of transverse heat conduction is restricted due to the large space between heat sources, the temperature difference between the chip-blank sections 523' and the chip-mounted sections 523 will be greater. The fillers 527 with low specific heat capacity are disposed in the chip-blank section for the purpose of absorbing few heat while the temperature is highly raised, thereby enhancing the temperature in the low temperature region and reducing the temperature difference between the low temperature region and the high temperature region. If the metallic base 520 is copper whose specific heat capacity is 386 J/Kg·° C., the material of the fillers 527 with low specific heat capacity can be at least one of lead (130 J/Kg·° C.), molybdenum (248 J/Kg·° C.), platinum (133 J/Kg·° C.) and tin (228 J/Kg·C); if the metallic base 520 is aluminum whose specific heat capacity is 905 J/Kg·° C., the fillers 527 with low specific heat capacity have more candidates, the requirement is a lower specific heat capacity compared with that of aluminum (lower than 905 J/Kg·° C.), and the objective of the disclosure consequently can be achieved.

Figure 6A:
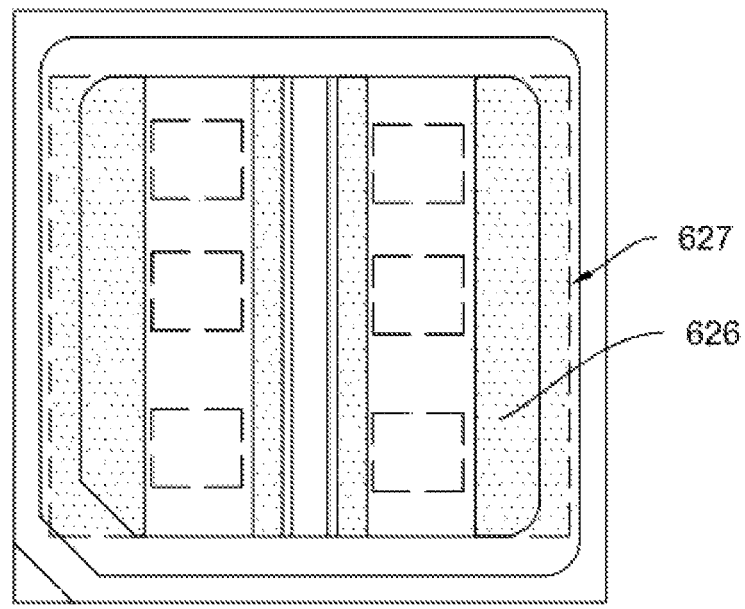
FIG. 6a is a top structural schematic view of another LED leadframe of the third embodiment of the disclosure.
Figure 6B:
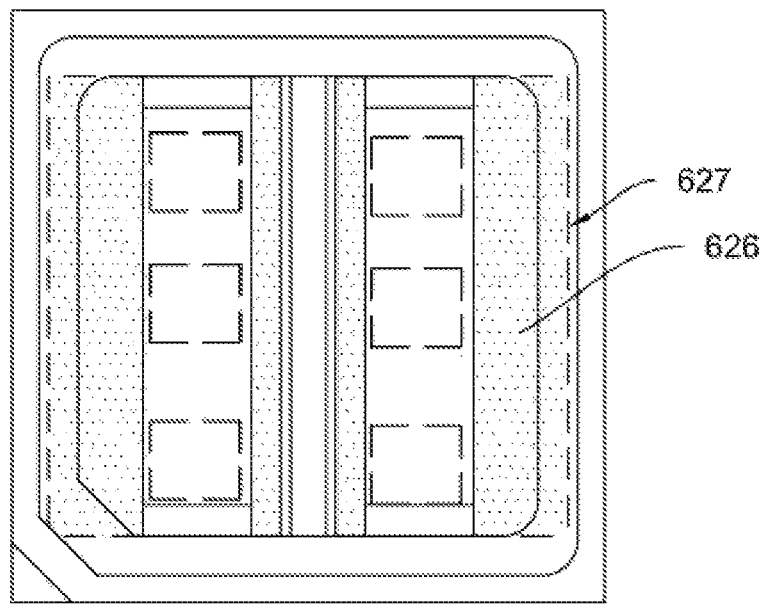
FIG. 6b is a top structural schematic view of still another LED leadframe of the third embodiment of the disclosure.

Analogously, in order to reduce manufacturing difficulty and costs, the chip-mounted sections can be adjusted according to the number and shape thereof. For instance, as shown in FIG. 6a and FIG. 6b, chip-mounted sections 623 are symmetrically distributed on the left side and the right side (or the upper side and the lower side instead) of the bar-shaped insulating section. Regions between the chip-mounted sections 623 and the bar-shaped insulating section 611 and regions from the chip-mounted sections 623 to edges of the metallic base 610 all belong to the chip-blank sections 623'. The second grooves 626 corresponds to the chip-mounted sections 623, specifically is surrounding or clamping the entire chip-mounted sections 623 to form large-sized second grooves 626 filled with the filler 627 with low specific heat capacity. Of course, the thermally conductive fillers can be regulated according to specific positions of the chip-mounted sections. In other embodiments, the bar-shaped insulating section is disposed leftward or rightward with respect to the symmetrical axis of the die bonding region rather than on the symmetrical axis. In the situation, the LED chips can be disposed asymmetrically such as on one side of the bar-shaped insulating section, or more on the left side but less on the right side, or more on the right side but less on the left side; correspondingly the thermally conductive fillers are disposed in the chip-mounted sections.

Figure 6C:
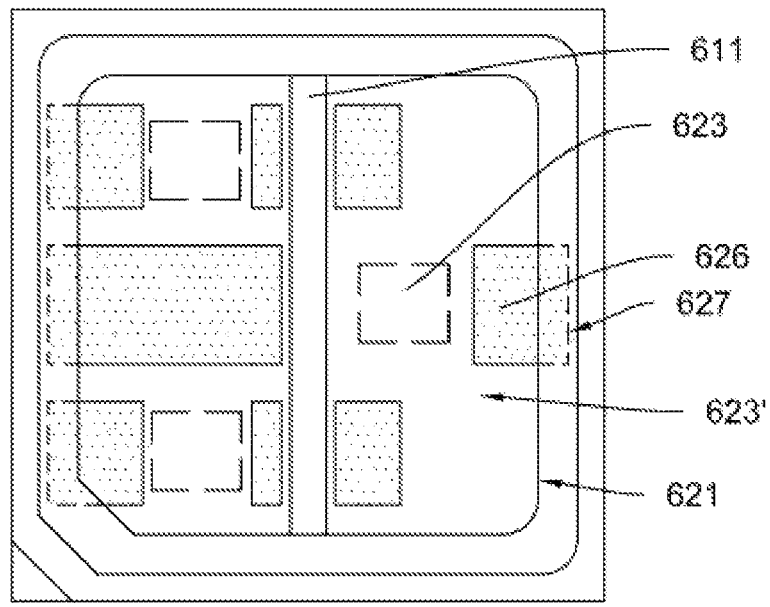
FIG. 6c is a top structural schematic view of further still another LED leadframe of the third embodiment of the disclosure.

With respect to a light emitter including odd number of LED chips, as the chip-mounted sections are asymmetrical, shapes of the defined second grooves and fillers with low specific heat capacity are irregular. For instance, as shown in FIG. 6c, the three chip-mounted sections 623 are arranged at three vertices of a triangle in the die bonding region 621; the chip-mounted sections 623 are asymmetrically disposed on two sides of the bar-shaped insulating section 611. Two chip-mounted sections 623 are arranged upright on the left side of the bar-shaped insulating section 611, and one chip-mounted section 623 is centrally disposed on the right side. The second grooves 626 are defined in the chip-blank section 623'. As the shape of the chip-blank section 623' is uncertain, shapes of the second grooves 626 are various correspondingly. Sizes and shapes of the second grooves 626 and fillers 627 with low specific heat capacity in the chip-blank section 623' should be determined according to the specific space thereof, as long as the requirements on the second grooves and the fillers with low specific heat capacity according to the embodiment can be met, the objective of the disclosure can be accordingly obtained.

In addition, the thermally conductive fillers can be highly thermal conductive fillers or fillers with high CTE. For instance, if the metallic base is pure copper whose thermal conductivity is 401 W/mK, the thermally conductive fillers can be made of pure silver whose thermal conductivity is 429 W/mK or graphene whose thermal conductivity is 5300 W/mK. If the metallic base is an aluminum, the thermally conductive fillers can be any one of copper, silver and graphene.

Figure 6D:
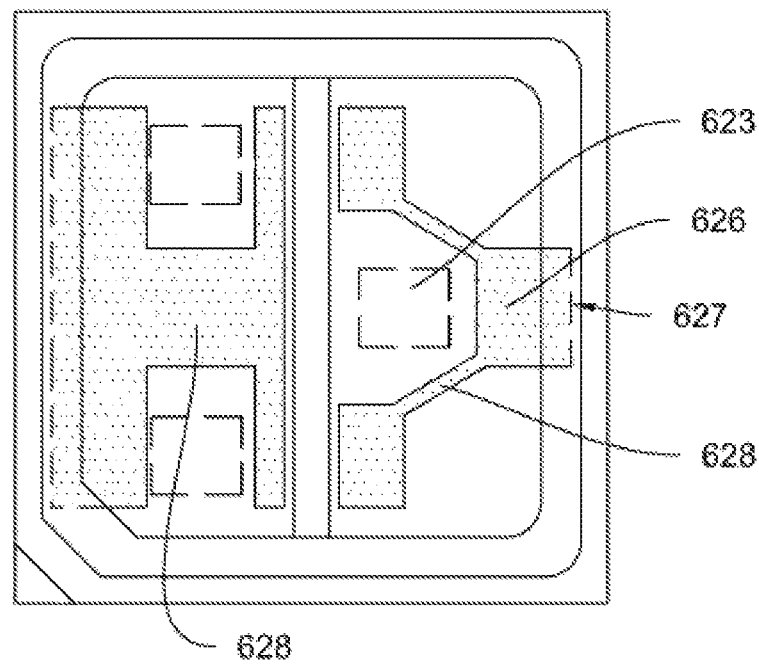
FIG. 6d is a top structural schematic view of even still another LED leadframe of the third embodiment of the disclosure.

Preferably, in order to simplify the manufacturing process and improve the procedure efficiency, a second connective channel 628 can be defined between two adjacent second grooves 626, and the second connective channel 628 is further filled with the thermally conductive filler 627. In combination with the illustration of FIG. 6d, in contrast with the LED leadframe in FIG. 5b, two second grooves 626 both on the left side of the bar-shaped insulating section 611 are communicated through the second connective channel 628 as a whole, and a top view thereof is about H-shaped; the second grooves 626 on the right side of the bar-shaped insulating section 611 are communicated through the second connective channels 628 and thereby form an polygon from initial island-like and individual shapes. Afterwards, the thermally conductive fillers 627 subsequently can be poured simultaneously and thus are integrally formed.

Regarding the size of the filler 627 with low specific heat capacity and the definition of specific heat capacity, the specific heat capacity formula is $C=Q/(m*\Delta T)$.

Where Q=LED electrical power−optical power, and Q can be deemed to be a constant. Parameters of fillers with low specific heat capacity and metallic base are substituted into the specific heat capacity formula can obtain a ratio of specific heat capacity $C_{lshcf}$ of the filler with low specific heat capacity to specific heat capacity $C_{mb}$ of the metallic base, and the following formula 1 is achieved.

$$C_{lshcf}/C_{mb}=(m_{mb}*\Delta T_{mb})/(m_{lshcf}*\Delta T_{lshcf}) \quad \text{Formula 1}$$

Where the subscript mb represents the metallic base, and the subscript lshcf represents the filler with low specific heat capacity.

If the temperature difference in a conventional die bonding region is approximately 16° C., and the target temperature difference of the disclosure should be restricted within 5° C., a following formula 2 is set forth.

$$C_{lshcf}/C_{mb}=(16*\rho_{mb}*V_{mb})/(5*\rho_{lshcf}*V_{lshcf}) \qquad \text{Formula 2}$$

Where ρ designates the density, and V is the volume.

It can be learnt that as long as materials of the fillers with low specific capacity and the metallic base are determined, known parameters can be substituted into formula 2 to obtain the volume of fillers with low specific heat capacity $V_{lshcf}$. Moreover, the proper filling thickness and area of fillers with low specific heat capacity then can be determined according to the thickness of the metallic base.

The embodiment introduces fillers with low specific heat capacity into a region of the metallic base distant from the LED chips and flexibly adjusts shapes and sizes of fillers with low specific heat capacity, the addition of fillers with low specific heat capacity can absorb heat to slow down the cooling rate in regions whose temperature is low, and thus the temperature of the entire metallic base tends to be consistent.

Fourth Embodiment

A difference between the embodiment and the first embodiment is that the embodiment attempts to change the size of the metallic base and reduce the distance between the insulating layer and LED chips, so as to chase the objective of decreasing the temperature difference between regions with high and low temperatures.

Figure 7:
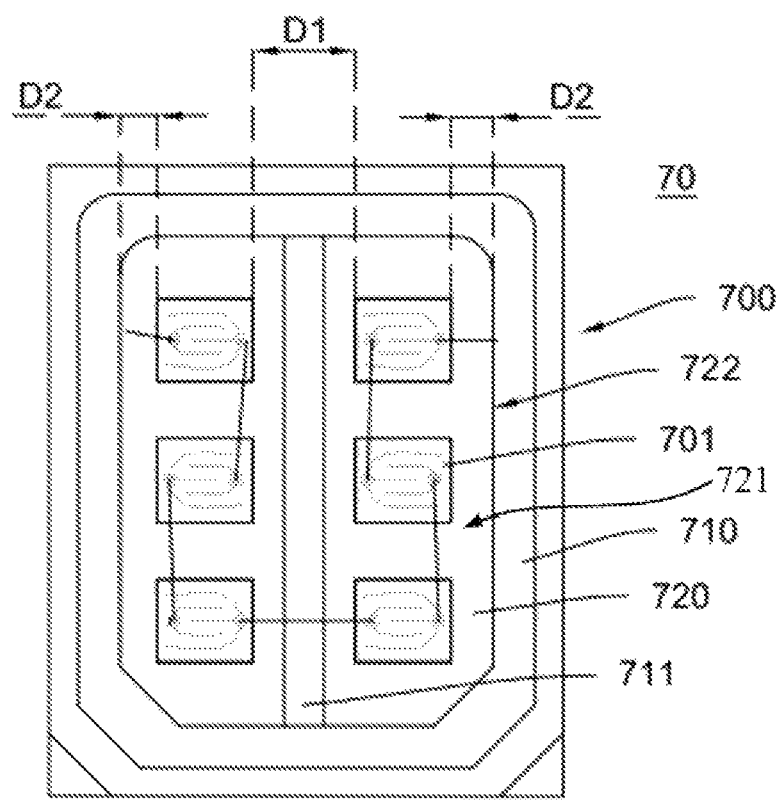
FIG. 7 is a top structural schematic view of a light emitting device of a fourth embodiment of the disclosure.

As shown in FIG. 7, the embodiment provides a light emitting device 70, including a LED leadframe 700 and LED chips 701. The LED leadframe 700 includes a metallic base 720 and an insulating layer 710 disposed on the metallic base 720.

Specifically, the metallic base 720 includes a die bonding region 721 and a peripheral region 722 surrounding the die bonding region 721. The die bonding region 721 is configured for securing the LED chips 701. The die bonding region 721 can be square, rectangle, round or other geometrical shape.

The insulating layer 710 is disposed on the metallic base 720 and located in the peripheral region 722 to define the die bonding region 721. The insulating layer 710 further includes a bar-shaped insulating section 711 disposed in the metallic base 720 and corresponding to the die bonding region 721.

A material of the insulating layer 710 preferably is EMC. A distance D1 between two adjacent LED chips 701 is 0.8 mm (i.e., D1=0.8 mm), a distance from a center of the insulating layer 710 to a center of the adjacent LED chip 701 can be calculated to be 0.4 mm, and a distance D2 from the insulating layer 710 to an edge of the adjacent LED chip 701 is 0.45 mm (i.e., D2=0.45 mm) which is less than 0.5 mm. The size of the metallic base 720 is reduced to close the EMC located at edges of the metallic base 720 and the LED chips 701, which can effectively prevent the problem of huge temperature difference due to far distances.

The aforementioned first embodiment, second embodiment, and third embodiment merely are exemplary embodiments of the disclosure. On the prerequisite of technical features being not conflictive, structures being not contradictive and the inventive purpose of the disclosure being not obeyed, the embodiments can be freely combined for application.

What is claimed is:

1. A LED leadframe configured for mounting a LED chip(s), wherein the LED leadframe comprises:

a metallic base, comprising a die bonding region and a peripheral region surrounding the die bonding region; wherein the die bonding region is configured for mounting the LED chip(s) on an upper surface thereof, the die bonding region comprises a chip-mounted section(s) and a chip-blank section, and the chip-mounted section is defined by a projection of the LED chip on the upper surface;

an insulating layer, disposed on the metallic base and located in the peripheral region to define the die bonding region;

wherein the metallic base further comprises at least one first groove downwardly recessed in the metallic base from the upper surface and arranged corresponding to the chip-mounted section(s), the at least one first groove is filled with a thermally conductive filler in contact with the metallic base, and a thermal conductivity of the thermally conductive filler is larger than a thermal conductivity of the metallic base.

2. The LED leadframe according to claim 1, wherein a first connective channel is defined between adjacent two of the at least one first groove, and the first connective channel is filled with the thermally conductive filler.

3. The LED leadframe according to claim 1, wherein the amount of the at least one first groove is multiple, and the multiple first grooves are distributed to be axisymmetric or non-axisymmetric.

4. The LED leadframe according to claim 1, wherein the metallic base further comprises at least one second groove defined corresponding to the chip-blank section, the at least one second groove is filled with a second filler, and a specific heat capacity of the second filler is lower than a specific heat capacity of the metallic base.

5. The LED leadframe according to claim 4, wherein a second connective channel is defined between adjacent two of the at least one second groove, and the second connective channel is filled with the second filler.

6. The LED leadframe according to claim 4, wherein the at least one second groove extends into the peripheral region.

7. The LED leadframe according to claim 4, wherein amount of the at least one second groove is multiple, and the multiple second grooves are distributed to be axisymmetric or non-axisymmetric.

8. A LED leadframe configured for securing a LED chip, wherein the LED leadframe comprises:

a metallic base, comprising a die bonding region and a peripheral region surrounding the die bonding region; wherein the die bonding region is configured for securing the LED chip on an upper surface thereof, the die bonding region comprises a chip-mounted section and a chip-blank section;

an insulating layer, disposed on the metallic base and located in the peripheral region to define the die bonding region;

wherein the metallic base further comprises a second groove downwardly recessed in the metallic base from the upper surface and arranged corresponding to the chip-blank section, the second groove is filled with a filler in contact with the metallic base, and a specific heat capacity of the filler is smaller than a specific heat capacity of the metallic base and thereby the filler is capable of absorbing heat for enhancing a temperature in the chip-blank section to reduce a temperature difference between the chip-blank section and the chip-mounted section.

9. The LED leadframe according to claim 8, wherein the metallic base further comprises a first groove downwardly recessed in the metallic base from the upper surface and arranged corresponding to the chip-mounted section, the first groove is filled with a thermally conductive filler in contact with the metallic base, and a thermal conductivity of the thermally conductive filler is larger than a thermal conductivity of the metallic base.

10. A light emitting device comprising: LED chips, a package glue and a LED leadframe;
wherein the LED leadframe comprises:
a metallic base, comprising a die bonding region and a peripheral region surrounding the die bonding region; wherein the die bonding region comprises chip-mounted sections and a chip-blank section, the LED chips are mounted on the chip-mounted sections of an upper surface of the die bonding region, and each of the chip-mounted sections is defined by a projection of a corresponding one of the LED chips on the upper surface;
an insulating layer, disposed on the metallic base and located in the peripheral region to define the die bonding region;
wherein the metallic base further comprises first grooves downwardly recessed in the metallic base from the upper surface and arranged corresponding to the chip-mounted sections, the first grooves are filled with a thermally conductive filler in contact with the metallic base, and a thermal conductivity of the thermally conductive filler is larger than a thermal conductivity of the metallic base;
wherein the package glue is filled in the die bonding region and covers the LED chips.

11. The light emitting device according to claim 10, wherein a first connective channel is defined between adjacent two of the first grooves, and the first connective channel is filled with the thermally conductive filler.

12. The light emitting device according to claim 10, wherein the first grooves are distributed to be axisymmetric or non-axisymmetric.

13. The light emitting device according to claim 10, wherein the metallic base further comprises one second groove defined corresponding to the chip-blank section, the second groove is filled with a second filler, and a specific heat capacity of the second filler is lower than a specific heat capacity of the metallic base.

14. The light emitting device according to claim 13, wherein a second connective channel is defined between adjacent two of the second grooves, and the second connective channel is filled with the second filler.

15. The light emitting device according to claim 13, wherein the second grooves extend into the peripheral region.

16. The light emitting device according to claim 13, wherein the second grooves are distributed to be axisymmetric or non-axisymmetric.

17. A light emitting device comprising: LED chips, a package glue and a LED leadframe;
wherein the LED leadframe comprises:
a metallic base, comprising a die bonding region and a peripheral region surrounding the die bonding region, the die bonding region comprising chip-mounted sections and a chip-blank section, wherein the LED chips are mounted on the chip-mounted sections of an upper surface of the die bonding region;
an insulating layer, disposed on the metallic base and located in the peripheral region to define the die bonding region;
wherein the metallic base further comprises at least one second groove downwardly recessed in the metallic base from the upper surface and arranged corresponding to the chip-blank section, the at least one second groove is filled with a filler in contact with the metallic base, and a specific heat capacity of the filler is smaller than a specific heat capacity of the metallic base and thereby the filler is capable of absorbing heat for enhancing a temperature in the chip-blank section to reduce a temperature difference between the chip-blank section and the chip-mounted section;
wherein the package glue is filled in the die bonding region and covers the LED chips.

18. The light emitting device according to claim 17, wherein the metallic base further comprises first grooves downwardly recessed in the metallic base from the upper surface and arranged corresponding to the chip-mounted sections, the first grooves are filled with a thermally conductive filler in contact with the metallic base, and a thermal conductivity of the thermally conductive filler is larger than a thermal conductivity of the metallic base.

19. The LED leadframe according to claim 1, wherein the insulating layer comprises a bar-shaped insulating section disposed in the metallic base and corresponding to an insulating region in the die bonding region, and the metallic base is divided into two parts by the bar-shaped insulating section; the chip-mounted sections are distributed on two sides of the bar-shaped insulating section; and the metallic base is made of a metal.

20. The LED leadframe according to claim 8, wherein the insulating layer comprises a bar-shaped insulating section disposed in the metallic base and corresponding to an insulating region in the die bonding region, and the metallic base is divided into two parts by the bar-shaped insulating section; an amount of the chip-mounted section is multiple, and the multiple chip-mounted sections are distributed on two sides of the bar-shaped insulating section.

* * * * *